US006025616A

United States Patent [19]

[11] Patent Number: 6,025,616

[45] Date of Patent: Feb. 15, 2000

Nguyen et al.

[54] POWER DISTRIBUTION SYSTEM FOR SEMICONDUCTOR DIE

[75] Inventors: Toan Dinh Nguyen; Michael T. Johnson, both of Plymouth, Minn.

[73] Assignee: Honeywell Inc., Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/882,714

[22] Filed: Jun. 25, 1997

[51] Int. Cl.[7] .......................... H01L 29/76; H01L 29/94; H01L 31/062; H01L 31/113

[52] U.S. Cl. .......................... 257/207; 257/691; 257/700; 257/211; 257/208; 257/393; 257/903

[58] Field of Search .................................... 257/207, 208, 257/211, 691, 700, 758, 690, 786, 676, 203, 692, 693, 698, 393, 903

[56] References Cited

U.S. PATENT DOCUMENTS

| | | | |
|---|---|---|---|
| 4,701,778 | 10/1987 | Aneha et al. | 257/207 |
| 4,862,322 | 8/1989 | Rickford et al. | 257/735 |
| 5,111,271 | 5/1992 | Hatada et al. | 257/207 |
| 5,227,232 | 7/1993 | Lim | 257/670 |
| 5,229,639 | 7/1993 | Hansen et al. | 257/692 |
| 5,231,305 | 7/1993 | Russell | 257/678 |
| 5,300,798 | 4/1994 | Yamazaki et al. | 257/207 |
| 5,311,048 | 5/1994 | Takahashi et al. | 257/207 |
| 5,384,487 | 1/1995 | Rostoker et al. | 257/666 |
| 5,391,920 | 2/1995 | Tsuji | 257/207 |
| 5,616,954 | 4/1997 | Tobase | 257/668 |
| 5,625,225 | 4/1997 | Huang et al. | 257/700 |
| 5,629,559 | 5/1997 | Miyahara | 257/666 |
| 5,668,389 | 9/1997 | Jassowski et al. | 257/207 |
| 5,670,802 | 9/1997 | Koike | 257/207 |
| 5,672,911 | 9/1997 | Patil et al. | 257/691 |
| 5,744,870 | 4/1998 | Casper | 257/784 |
| 5,789,791 | 8/1998 | Bergemont | 257/211 |
| 5,789,807 | 8/1998 | Correale, Jr. | 257/691 |
| 5,831,315 | 11/1998 | Kengeri et al. | 257/393 |

OTHER PUBLICATIONS

Patent Abstracts of Japan, vol. 014, No. 273 (E–0940), Jun. 13, 1990 and JP 02 086131 A (Seiko Epson Corp), Mar. 27, 1990.

Patent Abstracts of Japan, vol. 012, No. 030 (E–578), Jan. 28, 1988 and JP 62 188261 A (Sony Corp), Aug. 17, 1987.

Patent Abstracts of Japan, vol. 007, No. 170 (E–189), Jul. 27, 1983 and JP 58 078439 A (Nippon Denki KK), May 12, 1983.

Patent Abstracts of Japan, vol. 015, No. 046 (E–1029) Feb. 4, 1991, and JP 02 278849 A (Fujitsu Ltd), Nov. 15, 1990.

*Primary Examiner*—Alexander Oscar Williams
*Attorney, Agent, or Firm*—Gregory A. Bruns

[57] ABSTRACT

A power distribution system for a semiconductor die includes bonding pads located adjacent to and connected to power busses with connections between the bonding pads providing a parallel path for current. Connections may be provided by stitch bonds, by conductors within a substrate or by other means.

13 Claims, 3 Drawing Sheets

16
24
26

POWER DISTRIBUTION SYSTEM FOR SEMICONDUCTOR DIE

BACKGROUND OF THE INVENTION

The present invention relates generally to gate arrays, more particularly to an electrical distribution system for gate arrays exposed to radiation environments, and specifically to gate arrays that may experience short term exposure to a high level of ionizing radiation. This type of exposure is referred to as dose rate or prompt dose.

It is well known to use standardized gate arrays to construct semi-custom integrated circuits. A gate array formed in a semiconductor die or chip requires an electrical power distribution or power bussing system to provide the necessary voltage levels to circuits integrated in the die. This electrical distribution system typically takes the form of a conductive paths for providing a positive voltage, for example 3 volts and a conductive path for providing a reference voltage, for example ground. For gate array applications not subject to radiation environments the electrical distribution system is designed to meet various requirements and to provide the proper voltage level throughout the entire chip. To meet this requirement considerations is given to factors such a resistive voltage drops along the bus and electromigration. For non radiation applications calculations for power bussing systems that consider the maximum current requirements and include appropriate safety factors can be made and these calculations along with knowledge of the integrated circuit layout details can be used to determine the conductor sizing and spacing in a relatively straight forward fashion.

The design of a power bussing system for a gate array that will be subjected to a high level of ionizing radiation requires that additional factors be considered. The photocurrents generated in PN junctions of semiconductors subjected to ionizing radiation such as gamma or X-rays cause soft error rates in SRAM circuits, storage devices and failures in ROM. The photocurrent effects are global, i.e., every device on a chip served by the same power bussing is simultaneously affected by the photocurrents. One of the most common problems that results from the dose rate event is the reduction in the differential power supply voltage, that is a reduction in the difference between the positive voltage, for example VDD and the reference voltage, for example VSS. This reduction of course occurs across individual devices, for example, transistors, across circuit paths in the chip and in the package and across bonding wires connecting the chip to the package. The cause of this reduction in the differential power supply voltage is the droop of the local VDD voltage and the rise of the local VSS voltage due to the photocurrent contributions of all circuit components generated through the finite resistance and inductance of the power bussing and chip package. The result of this reduction is to lower the transient radiation upset threshold voltage. In addition the reduction can permit latch-up and burn out a device at sufficiently high dose rates.

The details of the power supply bussing of the prior art can be explained with reference to FIG. 1 which shows a greatly simplified top view drawing of a power bussing arrangement for a portion of a radiation resistant chip as found in the prior art. Chip 2 includes a Vdd buss 4 and a Vss buss 6, each of which extend around the perimeter 9 of chip 2 and have chip bond pad 5 and chip bond pad 7 for connection to power and ground, respectively. Chip 2 is typically housed in a package 8 which includes a method for bringing power and ground to chip 2, for example, package Vdd bond pad 10 and package Vss bond pad 12 which receive power and ground through conductors (not shown) located within package 8. Individual pairs of power and ground busses are located within the chip. For example, second metal Vdd bus 16 and second metal Vss buss 18 comprise one pair and second metal Vdd Buss 20 and second metal Vss buss 22 comprise another pair. Several additional Vdd and Vss pairs would exist if a more complete top view of chip 2 were shown in FIG. 1. Within chip 2, first metal Vdd busses 24 are connected to Vdd buss 16 by vias 26 and extend horizontally. Transistors 28, for example, p-channel transistors, would be connected to first metal buss 24. First metal Vss busses 30 are connected to Vss buss 18 by vias 32 and extend horizontally. Transistors 34, for example, n-channel transistors, would be connected to first metal buss 30.

FIG. 1*a* shows a cross-sectional view of a first metal buss 24, via 26 and second metal buss 16.

When a dose rate event occurs electron hole pairs are formed at PN junctions and photocurrents result. Electrons are attracted to the Vdd voltage and flow, for example from chip areas to first metal busses 24 through vias 26 and Vdd busses 16 to Vdd pad 5. A voltage due to the IR drop and the Ldi/dt drop causes the voltage at first metal buss 24 to be reduced. Holes are attracted to the Vss voltage and flow, for example from chip areas to first metal busses 30 through vias 32 and Vdd busses 18 to Vss pad 7. A voltage due to the IR drop and the Ldi/dt drop causes the voltage at first metal buss 30 to rise. Thus the differential voltage between first metal Vdd buss 24 and first metal Vss buss 30 is reduced.

Using the approach of the prior art, an increased dose rate requirement means that the increased size or quantity of power buss pairs requires more chip space, which in turn means loss in gate count and/or routing resources which, in turn, can result in the original circuit design no longer fitting on the gate array.

Thus a need exists for an electrical power distribution system that will meet the requirement of higher dose rates without significantly increasing the power bussing network.

SUMMARY OF THE INVENTION

The present invention meets these and other needs by providing a power distribution system for a semiconductor die comprising:

a first plurality of bond pads distributed along a first path on said die and having underlying connections to integrated circuits requiring a voltage at a first level;

means for connection to a first source for said voltage at a first level;

first conductive means connecting said means for connection to a first source to said first plurality of bond pads with said first conductive means spaced from a surface of said die except at said first plurality of bond pads;

a second plurality of bond pads distributed along a second path on said die and having underlying connections to integrated circuits requiring a second voltage;

means for connection to a second source for said voltage at a second level; and second conductive means connecting said means for connection to a second source to said second plurality of bond pads with said second conductive means spaced from a surface of said die except at said second plurality of bond pads.

DETAILED DESCRIPTION

Figures 1, 1A:
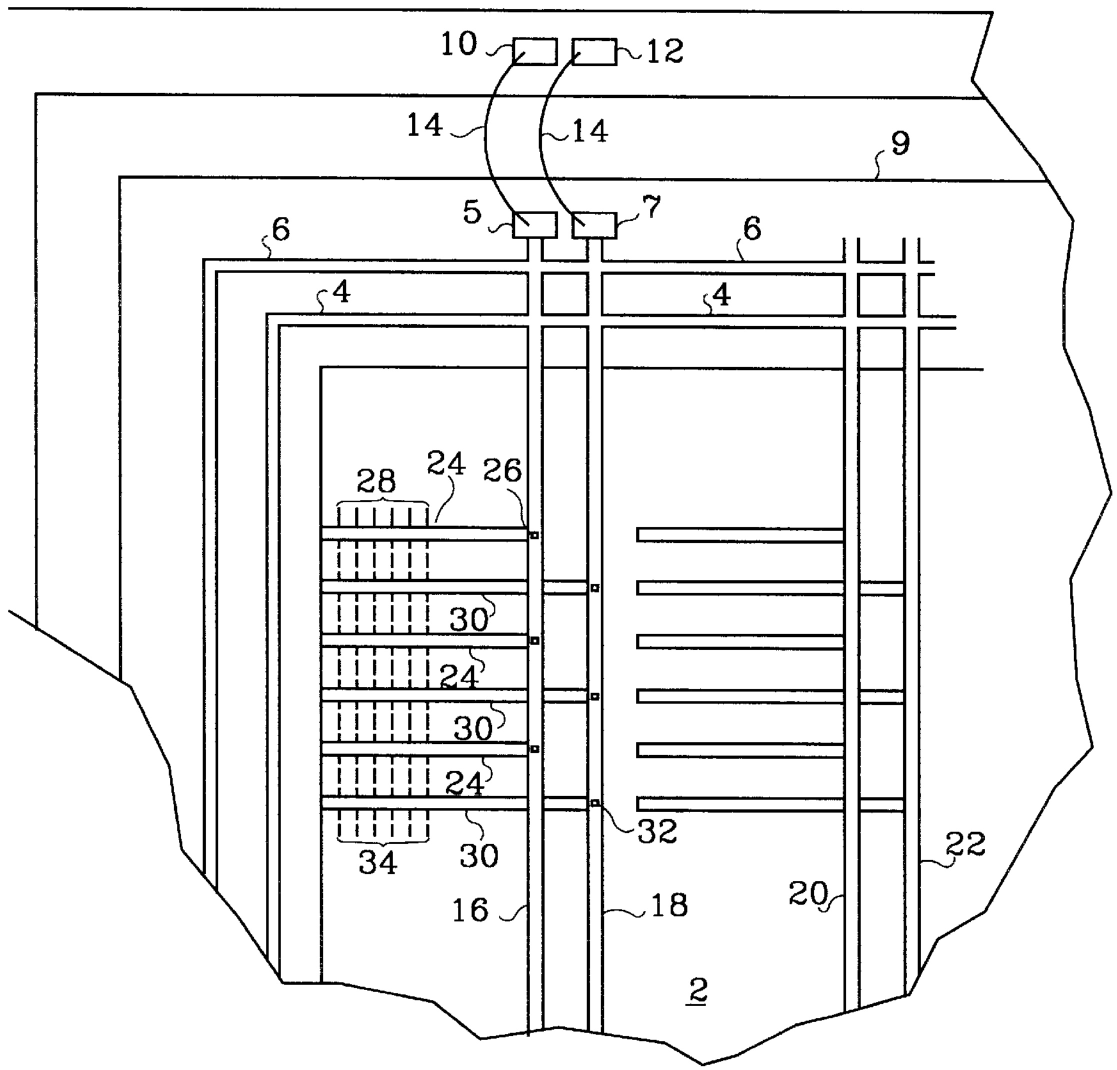
FIG. 1 is a plan view of a portion of a gate array chip according to the prior art.
FIG. 1*a* is a cross-sectional view of a portion of FIG. 1.

An electrical power distribution system for a semiconductor die according to the principles of the present invention is shown in the drawings and generally designated 50.

Figure 2:
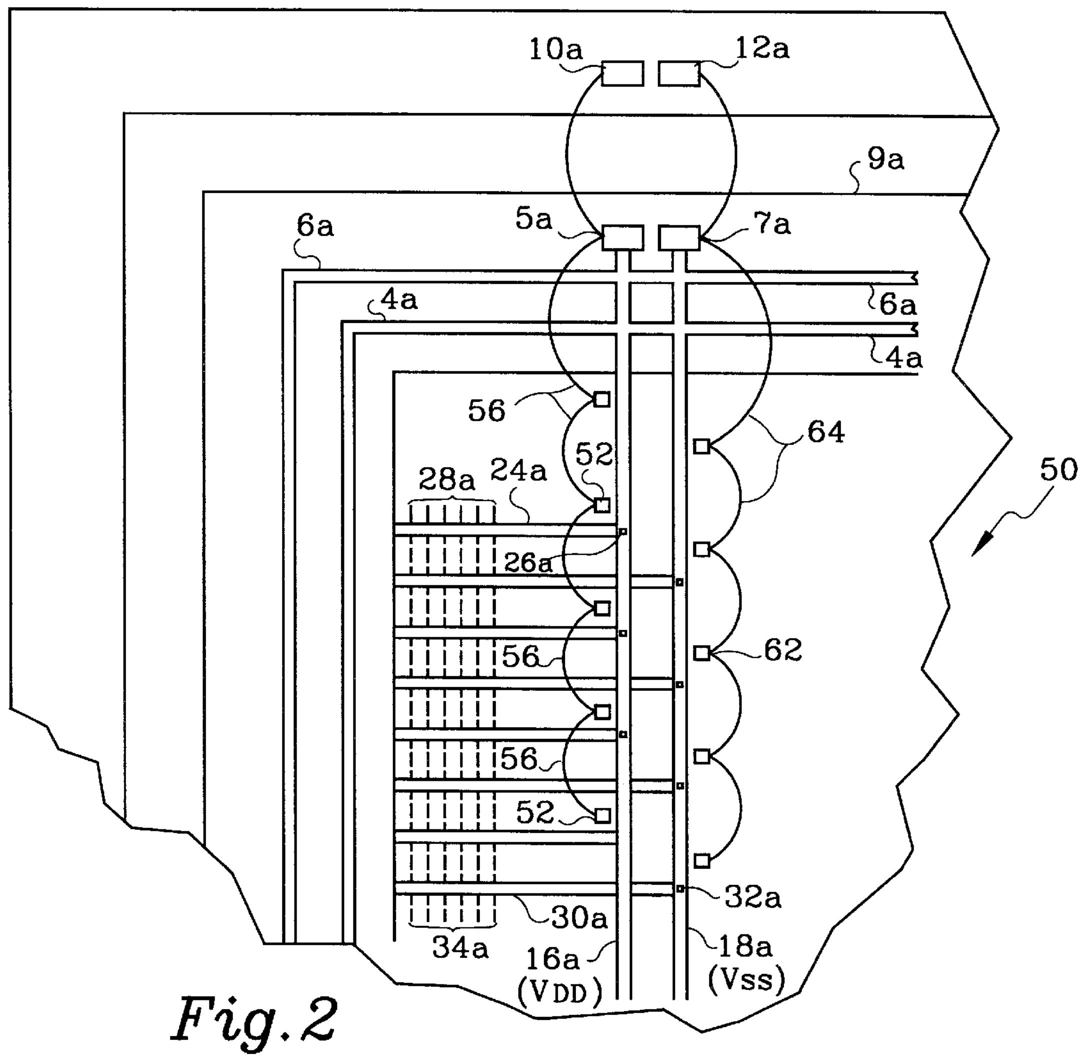
FIG. 2 is a plan view of a portion of a gate array chip according to the principles of the present invention.

Referring to FIG. 2 where reference numbers having the suffix "a" are used to designate items similar to those shown in FIG. 1. Power distribution system 50 includes, in a preferred embodiment, third metal Vdd bond pads 52 which are located adjacent second metal Vdd bus 16*a*. Bond pads 52 have a via connection to second metal connected to second metal Vdd buss 16*a*.

Figure 2A:
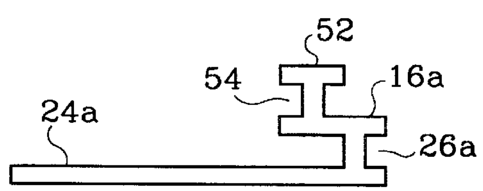
FIG. 2*a* is a cross-sectional view of a portion of FIG. 2.

A simplified cross-sectional drawing in FIG. 2*a* illustrates, for example, first metal Vdd buss 24*a*, via 26*a*, second metal Vdd buss 16*a*, and , bond pad 52 connected to second metal by via 54.

Thin wires 56 connect bond pads 52, bond pad 5*a* and bond pad 10*a*. Power distribution system 50 also includes Vss bond pads 62 which are connected by a via arrangement to second metal Vss buss 18*a* in a manner similar to that described for Vdd bond pads 52. Vss buss 18*a* is connected to first metal buss 32*a*. Thin wires 64 connect bond pads 62, bond pad 7*a* and bond pad 12*a*. Only one pair of Vdd and Vss busses are shown in FIG. 2 for simplicity, but it is to be understood that there are multiple pairs in the portion of the chip that is not shown.

Now that the construction of power distribution system 50 has been described, certain features may be set forth and appreciated. When a dose rate event occurs. electron hole pairs are generated. Electrons flow to Vdd buss 16*a* and holes flow to Vss buss 18*a*. As an example, electron flow into first metal Vdd buss 24*a* and then through via 26*a* to second metal buss 16*a*. At this juncture, the electron may flow along buss 16*a* or may flow through via 54 to bond pad 52 and through thin wires 56 to bond pad 5*a* and to bond pad 10*a*.

In a similar way, hole current will flow into first metal Vss buss 30*a* and then through via 32*a* to second metal Vss buss 18*a*. At this junction, hole current may flow along buss 18*a* or may flow through via connecting buss 18*a* to wire bond pad 62 and through thin wires 64 to bond pad 7*a* and bond pad 12*a*.

Figure 2B:
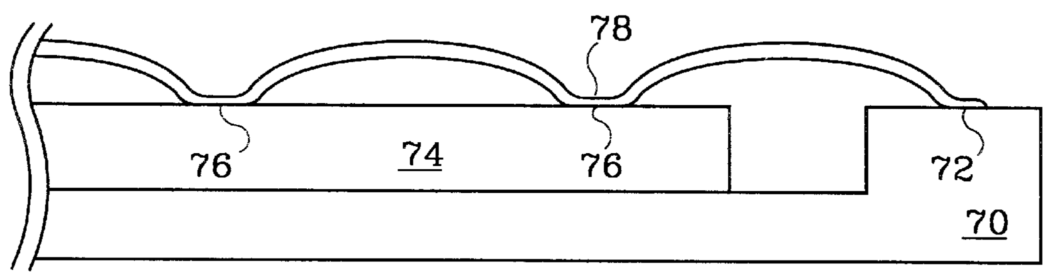
FIG. 2*b* is a cross-sectional drawing illustrating additional details of the present invention.

The embodiment of FIG. 2 may be implemented through the use of stitched bonding. Thin wires 56 and 64 are attached by stitched bonds. FIG. 2*b* shows a cross-sectional view of a portion of a package 70, with a power pad 72 and semiconductor die 74, with bond pads 76. Stitched bonds 78 extend from pad 72 to pads 76 and, according to the present invention, would act to shunt current from a power buss (not shown) within chip 74. Wire bonds are spaced from chip 74 except at bond pads located on the chip.

A simulation of the effect of the present invention shows dramatic results. The details of the simulation and the results are shown in Table 1.

TABLE 1

| | Vdd/Vss Bus Width | Stitch Bonds | Dose Rate Upset rad(Si)/Sec |
|---|---|---|---|
| Standard power bussing of gate array | 42.55 μm | No | 2E10 |
| Stitch bond approach | 42.55 μm | Yes | 1.3E11 |
| To obtain the same dose rate upset without stitch bonds, Vdd/Vss bus width needs to increase to: | 300 μm | No | 1.3E11 |

For the simulation of Table 1, the following conditions apply:

Bond wire diameter=1.25 mils

Aluminum pads for stitched bonds with passivation opening 88 μm×125 μm

Typical wire bond length between pads 75 mils to 80 mils

Chip active area 12,395 microns by 11,582 microns.

Photocurrent calculated at 1E11 rad(Si)/Sec=12.6A.

Thus Table 1 shows that to obtain the same dose rate upset achieved with stitched bonds, by simply increasing the buss width, it would be necessary to expand the buss width to 300 microns from 42.55 microns.

The present invention permits gate array applications that require higher dose rate upset. The present invention is easily implemented and the number of stitched bonds can vary depending on the dose rate requirements. Furthermore, stitch bonding may be implemented using a readily available standard manufacturing process.

Figure 3:
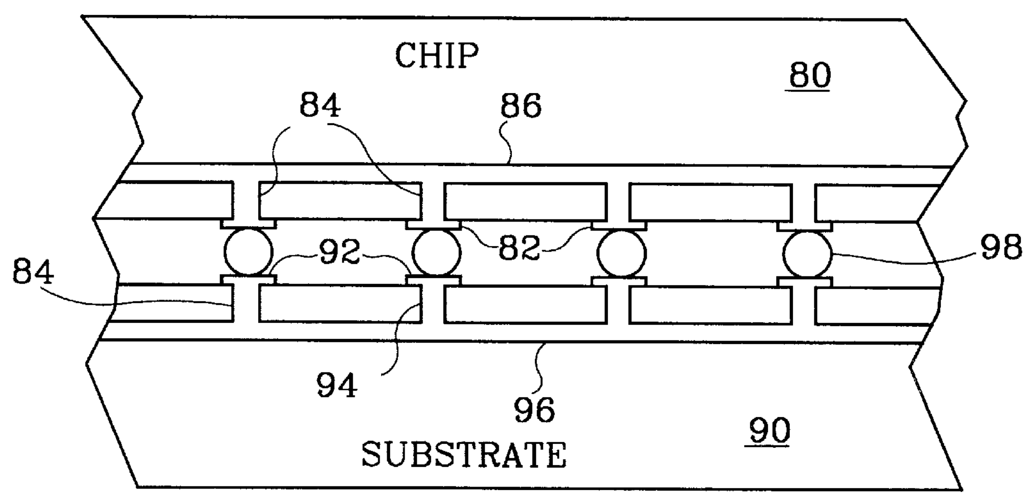
FIG. 3 is a cross-sectional view of an alternate embodiment of the present invention.

While the use of stitched bonds has been described, other embodiments of the present invention may be utilized. For example an alternate embodiment of power distribution system 50 is shown in FIG. 3 which is intended for a flip chip arrangement. In FIG. 3, chip 80 includes pads 82 connected by vias 84 to buss 86. Substrate 90 includes pads 92 connected by vias 94 to shunt buss 96. Pads 82 and pads 92 would be round rather than rectangular. Solder balls 98 separate chip 80 from substrate 90 prior to solder reflow. In operation, when a dose rate event occurs, electron hole pairs are generated. Current flows from chip 80 to substrate 90 through the solder balls 98 with a very low resistance and inductance path. This would result in a dramatic improvement on the dose rate upset.

The scope of the invention is to be indicated by the appended claims, rather than by the foregoing description, and all changes which come within the meaning and range of equivalency of the claims are intended to be embraced therein.

We claim:

1. A power distribution system for a semiconductor die comprising:

a first plurality of bond pads distributed along a first path on said die and having connections to a first buss integral to said die and requiring a voltage at a first level;

means for connection to a first source for said voltage at a first level;

first conductive means connecting said means for connection to a first source to said first plurality of bond pads with said first conductive means spaced from a surface of said die except at said first plurality of bond pads, and having a sufficiently low resistance to shunt radiation induced currents away from said first buss;

a second plurality of bond pads distributed along a second path on said die and having connections to a second buss integral to said die and requiring a voltage at a second level;

means for connection to a second source for said voltage at a second level; and second conductive means connecting said means for connection to a second source to said second plurality of bond pads with said second conductive means spaced from a surface of said die except at said second plurality of bond pads, and having a sufficiently low resistance to shunt radiation induced currents away from said second buss.

2. Power distribution system of claim 1 wherein said means for connection to a first source and said means for connection to a second source are bonding pads and said first conductive means and said second conductive means are thin wires.

3. Power distribution system of claim 1 wherein said means for connection and said conductive means comprise stitched bonds.

4. Power distribution system of claim 1 wherein said means for connection to a first source and said means for connection to a second source are bonding pads and said first conductive means and said second conductive means comprise conductive paths housed in a substrate and having connection sites that match the locations of said first plurality of bond pads and said second plurality of bond pads.

5. In a semiconductor die having at least a first metal power buss connected to a second metal power buss and a first metal ground buss connected to a second metal ground buss the improvement comprising:

a first plurality of bond pads located adjacent said second metal power buss and connected to said second metal power buss;

first connection means extending between said first plurality of bond pads;

a second plurality of bond pads located adjacent said second metal ground buss and connected to said second metal ground bus; and second connection means extending between said second plurality of bond pads.

6. The improvement of claim 5 wherein said first connection means is spaced from a surface of said die and a resistance of said first connection means is substantially lower than a resistance of said second metal power buss.

7. The improvement of claim 5 wherein a resistance of said first connection means is selected so as to shunt a substantial portion of a current that would otherwise flow in said second metal buss.

8. The improvement of claim 6 wherein said connection means is stitched bonds.

9. The improvement of claim 6 wherein said connection means comprise conductive paths housed in a substrate and having connection sites that match the locations of said first plurality of bond pads and said second plurality of bond pads.

10. A power distribution system for a semiconductor die comprising:

a first plurality of bond pads distributed along a first path on said die and having underlying connections to a first integral buss requiring a voltage at a first level;

means for connection to a first source for said voltage at a first level;

first conductive means connecting said first plurality of bond pads with said first conductive means spaced from a surface of said die except at said first plurality of bond pads; and having a resistance so as to shunt radiation induced currents away from said first buss;

a second plurality of bond pads distributed along a second path on said die and having underlying connections to a second integral buss requiring a voltage at a second level;

means for connection to a second source for said voltage at a second level; and second conductive means connecting said second plurality of bond pads with said second conductive means spaced from a surface of said die except at said second plurality of bond pads and having a resistance so as to shunt radiation induced currents away from said second buss.

11. Power distribution system of claim 10 wherein said means for connection to a first source and said means for connection to a second source are bonding pads and said first conductive means and said second conductive means are thin wires.

12. Power distribution system of claim 11 wherein said means for connection and said conductive means are stitched bonds.

13. Power distribution system of claim 10 wherein said means for connection to a first source and said means for connection to a second source are bonding pads and said first conductive means and said second conductive means comprise conductive paths housed in a substrate and having connection sites that match the locations of said first plurality of bond pads and said second plurality of bond pads.

* * * * *